United States Patent
O'brien et al.

(10) Patent No.: US 7,867,891 B2
(45) Date of Patent: Jan. 11, 2011

(54) DUAL METAL INTERCONNECTS FOR IMPROVED GAP-FILL, RELIABILITY, AND REDUCED CAPACITANCE

(75) Inventors: Kevin O'brien, Portland, OR (US); Rohan Akolkar, Hillsboro, OR (US); Tejaswi Indukuri, Hillsboro, OR (US); Arnel M. Fajardo, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/316,304

(22) Filed: Dec. 10, 2008

(65) Prior Publication Data

US 2010/0140804 A1 Jun. 10, 2010

(51) Int. Cl.
*H01L 21/4763* (2006.01)
*H01L 21/44* (2006.01)
(52) U.S. Cl. ........................ 438/629; 438/677; 438/678
(58) Field of Classification Search ................ 438/629, 438/677, 678; 257/E21.579
See application file for complete search history.

(56) References Cited

U.S. PATENT DOCUMENTS

| | | | |
|---|---|---|---|
| 4,692,349 A * | 9/1987 | Georgiou et al. | 438/655 |
| 6,030,877 A * | 2/2000 | Lee et al. | 438/381 |
| 6,197,685 B1 * | 3/2001 | Domae et al. | 438/648 |
| 7,432,200 B2 | 10/2008 | Chowdhury | |
| 2004/0087117 A1 | 5/2004 | Leitz et al. | |
| 2006/0113542 A1 | 6/2006 | Isaacson et al. | |
| 2007/0235802 A1 | 10/2007 | Chong et al. | |
| 2008/0122101 A1 * | 5/2008 | Oku et al. | 257/762 |

FOREIGN PATENT DOCUMENTS

WO 2010/068530 A2 6/2010

OTHER PUBLICATIONS

International Search Report/Witten Opinion for Patent Application No. PCT/US2009/066334, mailed Jun. 22, 2010, 11 pages.

* cited by examiner

*Primary Examiner*—William M. Brewster
(74) *Attorney, Agent, or Firm*—Scott M. Lane

(57) ABSTRACT

Embodiments of apparatus and methods for forming dual metal interconnects are described herein. Other embodiments may be described and claimed.

14 Claims, 4 Drawing Sheets

DUAL METAL INTERCONNECTS FOR IMPROVED GAP-FILL, RELIABILITY, AND REDUCED CAPACITANCE

FIELD OF THE INVENTION

The field of invention relates generally to the field of semiconductor integrated circuit manufacturing and, more specifically but not exclusively, relates to forming dual metal interconnect structures for increased reliability and reduced capacitance.

BACKGROUND INFORMATION

The fabrication of microelectronic devices involves forming electronic components on microelectronic substrates, such as silicon wafers. These electronic components may include transistors, resistors, capacitors, and the like, with intermediate and overlying metallization patterns at varying levels, separated by dielectric materials. The metallization patterns interconnect, hence the term "interconnects", the electrical components to form integrated circuits. The term interconnect is defined herein to include all interconnection components including trenches and openings or vias filled with conductive material.

One process used to form interconnects is known as a "damascene process". In a typical damascene process, a photoresist material is patterned on a dielectric layer and the dielectric material is etched through the photoresist material patterning to form a hole or a via (hereinafter collectively referred to as "an opening" or "openings") to form a pathway between an underlying metal and an adjacent trench or other interconnect structure. The photoresist material is removed and the opening and trench are commonly coated with a barrier and a seed layer then filled with a low resistivity metal to form a conductive pathway through the opening and trench.

Formation of the conductive pathway through high aspect openings using common barrier, seed, and trench materials can compromise continuity of the seed layer on high aspect ratio opening surfaces leading to incomplete film coverage, can increase electromigration in the openings leading to reliability failures, and can limit thickness of the dielectric layer as a result of gap-fill constraints.

Turning now to the figures, the illustration in FIG. 1 (Prior Art) is a cross-sectional view of an opening 110 formed adjacent to a trench 120 formed over and directly adjacent to the opening 110, the opening 110 having an opening width 112 and an opening height 114. A barrier 130 is formed using a physical vapor deposition (PVD) process on a trench surface 140, an opening sidewall 150, and an underlying metal surface 160. Deposition of the barrier 130 using the PVD process results in a non-conformal barrier 130 thickness along the opening sidewall 150 due to the anisotropic nature of the deposition process. The non-conformal barrier 130 in the opening 110 can result in areas with thin or missing portions of a barrier 130 along a portion of the opening sidewall 150, leaving at least a portion of the opening sidewall 150 exposed.

The barrier 130 is a multi-layer film that typically consists of a tantalum nitride (TaN) film and a tantalum (Ta) film stack that is used to minimize or substantially prevent diffusion of contaminants across the barrier 130. An underlying metal 170 of copper (Cu) is formed in the dielectric region 180 using methods known to one skilled in the art. The dielectric region 180 is selectively formed of a dielectric material to electrically isolate conductors, reduce resistance capacitance ("RC") delay and improve device performance, such as silicon dioxide ($SiO_2$).

FIG. 2 (Prior Art) illustrates the device in FIG. 1 after forming a conductive layer 210 on the barrier 130. The conductive layer 210 is a multi-layer film of Cu that typically consists of a seed layer comprising Cu deposited using a PVD process followed by a thicker Cu layer deposited using an electroplating process to form the conductive layer in the opening 110 and the trench 120. Deposition of the PVD seed layer can exacerbate nonconformity exhibited by the barrier 130 when forming the conductive layer 210, leading to one or more voids 220 in the opening 110. Formation of the conductive layer 210 is challenging since the seed layer must be continuously formed along the opening sidewalls 150 using a largely anisotropic process to deposit the layer along vertical or nearly vertical opening sidewalls 150, meaning that a direction rate in the direction normal to a surface is much higher than in a direction parallel to the surface. Formation of the conductive layer 210, when formed with minimal voids (not shown), creates a seam near a center of the opening 110 created when the conductive layer 210 fills the opening 110 from substantially laterally opposite sidewalls.

The opening sidewalls 150 may be tapered (not shown) to provide a more robust seed layer deposition process, however via resistance and reliability is compromised since the tapered profile increases current density near the bottom of the opening 110 as the opening thickness 112 shrinks. As a result, an aspect ratio of the opening 110, or the ratio of the opening height 114 to the opening width 112 is limited to allow filling of the opening 110 using traditional methods. Limiting the aspect ratio forces a reduction in the opening height 114 as the opening width 112 continues to shrink, while increasing capacitance. Further, deposition of the barrier 130 on the underlying metal surface 160 creates an electrical barrier that also increases resistance to electrical flow between the conductive layer 210 and the underlying metal 170.

BRIEF DESCRIPTION OF THE DRAWINGS

The present invention is illustrated by way of example and not as a limitation in the figures of the accompanying drawings, in which FIG. 1 (Prior Art) is an illustration of a cross-sectional view of an opening formed adjacent to an overlying trench with a barrier formed on the trench and the opening.

DETAILED DESCRIPTION

An apparatus and methods for forming dual metal interconnect structures are described in various embodiments. In the following description, numerous specific details are set forth such as a description of a method to fabricate dual metal interconnect structures while allowing for continued miniaturization of interconnect openings and increased interconnect layer thickness. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

It would be an advance in the art of microelectronic device fabrication to form an interconnect using conventional dual damascene patterning techniques while providing a robust gap fill process for increased reliability and reduced capacitance. Fabrication of reliable vias, contacts, and other features with high aspect ratios, i.e., height divided by width, is necessary to support circuit density increases over a unit area of a substrate.

One such method may comprise depositing a dielectric layer over a patterned metal layer and etching the dielectric layer to form a trench and an opening to expose the patterned metal layer. The opening and the exposed patterned metal layer is pretreated and a refractory interconnect is formed in the pretreated opening. A barrier layer and a seed layer is formed on the trench and the refractory interconnect. A low resistivity metal is formed on the seed layer to provide an interconnect through the dielectric layer from the patterned metal layer to the low resistivity metal.

Figure 1:
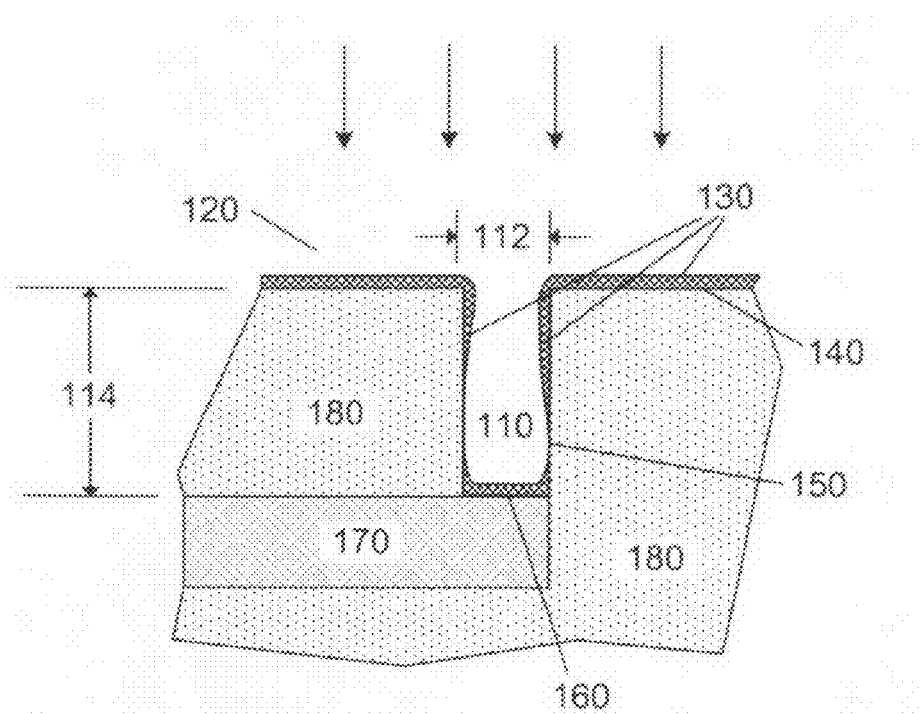
Figure 2:
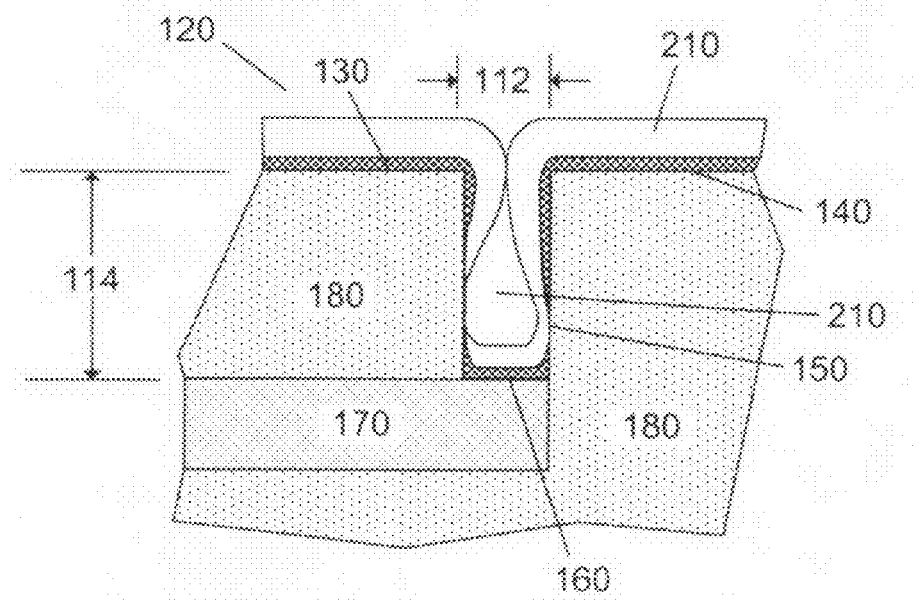
FIG. 2 (Prior Art) illustrates the device in FIG. 1 after forming a seed layer and conductive layer on the barrier.
Figure 3:
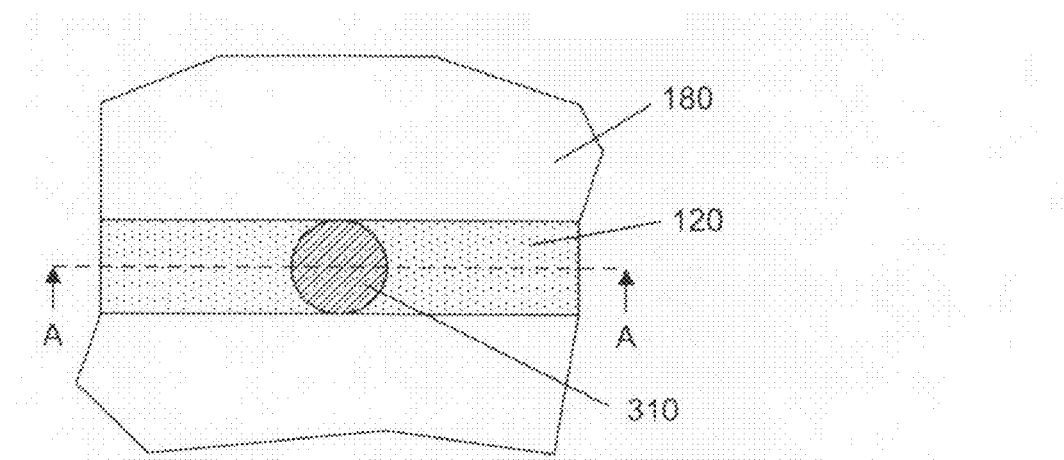
FIG. 3 is an illustration of a top view of a trench and an opening filled with refractory interconnect over an underlying metal layer.

As device density continues to increase, it is imperative to reduce capacitance, power consumption and related heat generation in microelectronic devices. Formation of interconnects with increasing aspect ratios and relatively thick interlayer dielectric layers require that openings used to form interconnects between the metal layers continue to shrink. Elimination of barrier layers and a reliable method for forming a continuous conducting plug in the opening 110 is of increasing importance. FIG. 3 is an illustration of a top view of the trench 120 and the opening 110 in the dielectric region 180 filled with a refractory interconnect 310 over the underlying metal 170, which is part of a patterned metal layer, in accordance with one embodiment of the invention.

The refractory interconnect 310 may be a contact, a line, a via, or another conducting element with an opening width 112 substantially equal to or larger than 50 nm, where the opening width 112 is a nominal width of the opening 110. The trench 120 may be shaped in a block pattern, a v-shaped pattern, a semi-circular pattern, and/or an irregular pattern etched or otherwise formed in the dielectric region 180. The dielectric region 180 may be formed using silicon oxide, lightly doped silicon oxide, a fluoropolymer, a porous silicon oxide, silicon oxynitride, and/or silicon nitride. In this embodiment, the trench 120 is positioned directly above the refractory interconnect 310. Alternately, the trench 120 may be positioned on a side of the refractory interconnect 310 (not shown) and directly adjacent to the refractory interconnect 310 to provide an exposed surface of the refractory interconnect 310. The trench 120 may be pretreated using argon (Ar) ion bombardment or a plasma process formed using a mixture of hydrogen ($H_2$) and helium (He), and/or a mixture of $H_2$ and Ar. Pretreatment of the trench 120 is performed, in one example, to reduce an oxide layer on exposed metal surfaces to promote catalytic behavior. The pretreatment process may be performed in a plasma chamber at a temperature ranging substantially between 100 to 200 degrees Celsius (° C.) and preferably about 150 (° C.). The plasma process may be applied substantially between 20 to 60 seconds using an applied power substantially between 200-1000 Watts.

The refractory interconnect 310 may be formed in the opening 110 using a selective deposition process that substantially fills high aspect ratio features, particularly at or above 3:1, originating from the bottom of the feature to avoid creation of voids, seams, and/or other defects in the opening 110. For example, the refractory interconnect 310 may be deposited in whole or at least in part by using an electroless deposition process that operates, for example, from a spontaneous reduction of a metal from a solution of its salt with a reducing agent or similar source of electrons in the presence of a catalyst or catalyst surface such as the underlying metal surface 160. In one embodiment, the refractory interconnect 310 is a metal that is selectively designed to diffuse slowly through the dielectric region 180 while providing electromigration resistance. Formation of the refractory interconnect 310 without deposition of an intervening barrier 130 between the dielectric region 180 and the refractory interconnect 310, which would otherwise consume a portion of the opening 110 while increasing process complexity and manufacturing cost, reduces resistance to electrical flow between the refractory interconnect 310 and an underlying metal 170. As a result, the refractory interconnect 310 may be formed directly on or adjacent to the underlying metal 170 and one or more walls or sides of the opening 110 without first forming a barrier 130. The trench 120 is formed using an etch process or another erosion process used to remove a portion of the dielectric region 180.

Figure 4:
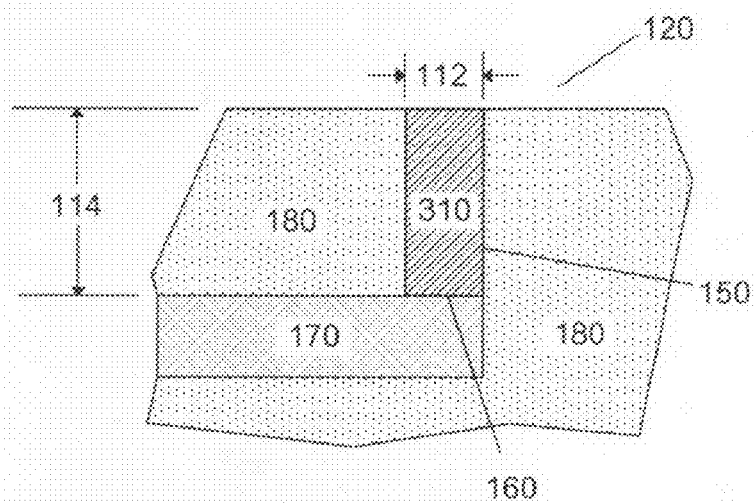
FIG. 4 is a cross-sectional view of FIG. 3 through line A-A illustrating the opening filled with refractory interconnect.

FIG. 4 is a cross-sectional view of FIG. 3 through line A-A illustrating the opening 110 filled with the refractory interconnect 310. The refractory interconnect 310 is selectively formed using a bottom-up formation process to prevent voids that would increase current density through the refractory interconnect 310. A process used to form the refractory interconnect 310 fills the opening 110 from the underlying metal surface 160 until the entire opening 110 is substantially filled, as shown in FIG. 4. The refractory interconnect 310 may be formed using electroless plating of cobalt (Co), nickel (Ni), palladium (Pd), platinum (Pt), tungsten (W), ruthenium (Ru), and their alloys. In one embodiment, the refractory interconnect 310 is formed from the bottom up. In another embodiment, the refractory interconnect 310, particularly in alloy form may be doped with, or contain small amounts of boron and/or phosphorus to impart amorphous properties.

Figure 5:
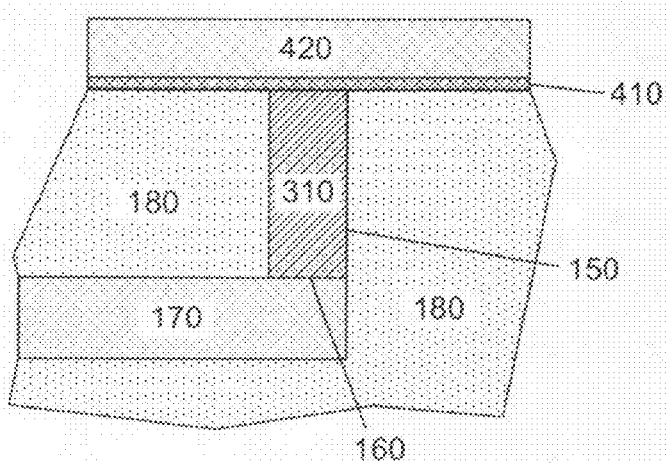
FIG. 5 illustrates the device in FIG. 4 after depositing a barrier layer, a seed layer and a conductive layer in a trench adjacent to and on the refractory interconnect.

FIG. 5 illustrates the structure of FIG. 4 after depositing a barrier layer 410, a trench interconnect 420 in the trench 120 adjacent to and on the refractory interconnect 310. In one embodiment, the barrier layer 410 has a thickness is generally in a range between 50 to 200 Angstroms. Also in this example, the trench interconnect 420, comprising a seed layer and an interconnect layer, may range substantially between 450 to 1800 Angstroms, resulting in a multi-layer stack with a total film thickness approximately between 500 to 2000 Angstroms. The seed layer, formed using a process such as physical vapor deposition (PVD) acts as a nucleation surface for the interconnect layer. The trench interconnect 420, comprising a seed layer and an interconnect layer, or conductor may be formed of the same material or from different materials. The trench interconnect 420, may be formed using one or more low resistivity metals such as silver (Ag), copper (Cu), aluminum (Al), and their alloys. The refractory interconnect 310 and the trench interconnect 420 are formed of two different materials, referred to here as a dual metal interconnect.

In this embodiment, the trench interconnect 420 is separated from the underlying metal 170 by the dielectric region 180 with a thickness roughly equivalent to the opening height 114. While the opening width 112 continues to shrink to allow greater device density, the opening height 114 remains relatively thick in comparison. Embodiments of the invention allow for progressively higher aspect ratio openings, or the ratio of the opening height 114 to the opening width 112, that would have otherwise been prohibited due to gap-fill constraints, thereby reducing capacitance and making the microelectronic device more power efficient.

Figure 6:
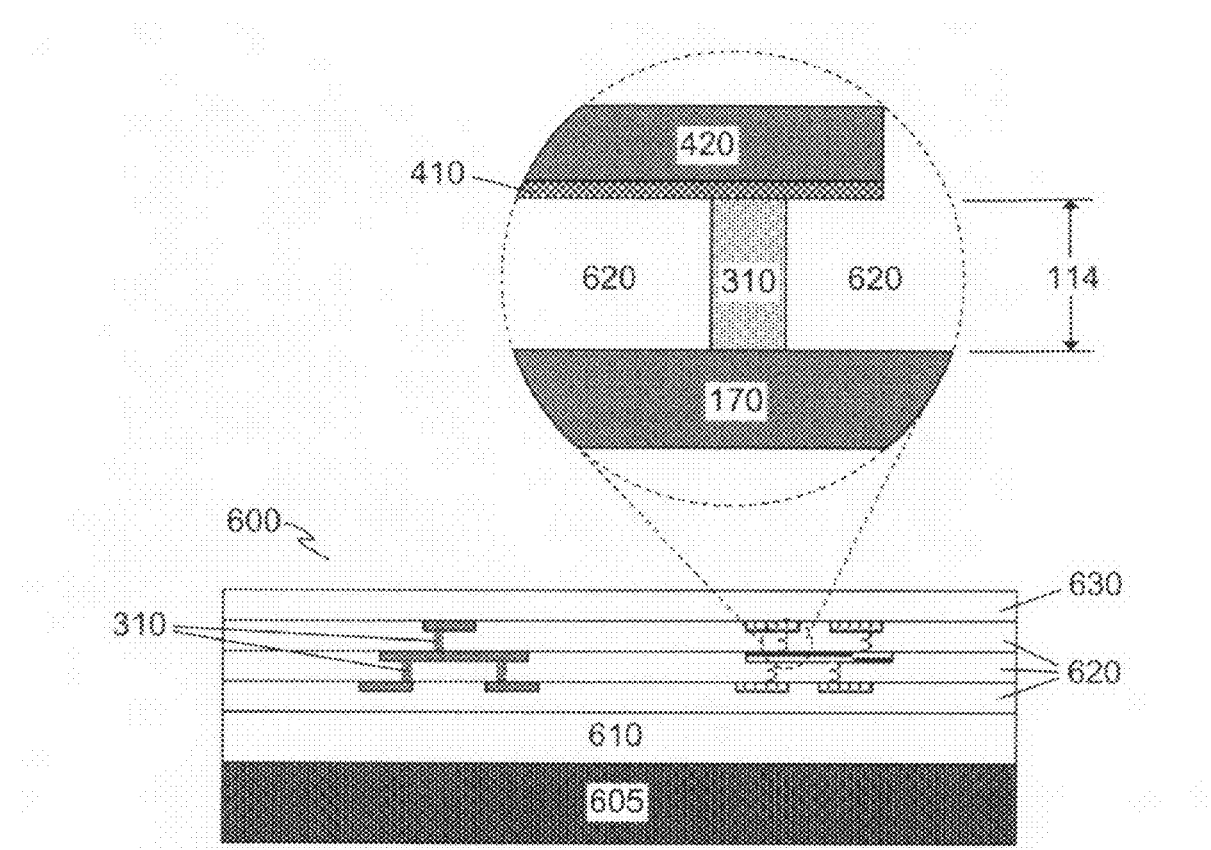
FIG. 6 illustrates a cross-sectional view of a dual metal interconnect in a device.

FIG. 6 illustrates a cross-sectional view of a dual metal interconnect in a microelectronic device 600, such as a central processing unit or a memory unit, in accordance with one embodiment. The microelectronic device 600 contains a substrate 605 that may comprise silicon, gallium arsenide (GaAs), or indium antimonide (InSb) in monocrystalline form. The substrate 605 may further comprise buried layers such as one or more silicon-on-insulator layers. One or more front end films are formed on the substrate 605 to form a pre-metal dielectric 610. The pre-metal dielectric 610 may comprise one or more films typically used in contemporary device fabrication known to one skilled in the art, such as silicon oxide, silicon nitride, doped or un-doped polysilicon, lanthanum oxide, tantalum oxide, titanium oxide, hafnium oxide, zirconium oxide, lead-zirconate-titanate (PZT), barium-strontium-titanate (BST), or aluminum oxide. The pre-metal dielectric layer 610 may be deposited using methods such as thermal deposition, plasma enhanced chemical vapor deposition (PECVD), high density chemical vapor deposition (HDCVD), and/or sputtering.

A series of interlayer dielectric layers 620 comprising refractory interconnects 410, a trench barrier 420, and a trench conductor 430 are formed over the pre-metal dielectric layer 610. The interlayer dielectric layers 620 may comprise a silicon oxide, silicon nitride, or a low k dielectric (e.g., k<3) such as carbon-doped oxide (CDO). The interlayer dielectric layers 620 may be planarized, or polished using a process such as chemical mechanical planarization (CMP). The planarization process erodes a top portion of the dielectric material to create a uniform surface while improving the optical resolution of subsequent lithography steps. In one embodiment, the refractory interconnects 310 are filled with one or more refractory metals such as cobalt (Co), nickel (Ni), palladium (Pd), platinum (Pt), tungsten (W), ruthenium (Ru), and their alloys while the trench interconnects 420 and underlying metals 170 are formed by a damascene or dual-damascene process with copper or a copper alloy using an electroplating process to fill recesses such as trenches 120 in the interlayer dielectric layers 620. The trench interconnects 420 and the interlayer dielectric layers 620 may be planarized using a CMP process or another planarizing process known to one skilled in the art.

An interface dielectric 630 is formed over the interlayer dielectric layers 620, refractory interconnects 310, and the trench interconnects 420. The interface dielectric 630 is formed from a dielectric film with barrier properties, such as a silicon nitride or silicon oxynitride film. In another embodiment, a spin-on polymer "buffer coat" is applied on top of the silicon nitride or silicon oxynitride film. The interface dielectric 630 is patterned and etched using methods known to one skilled in the art to form a pathway to the underlying trench interconnects 420 and refractory interconnects 310.

Figure 7:
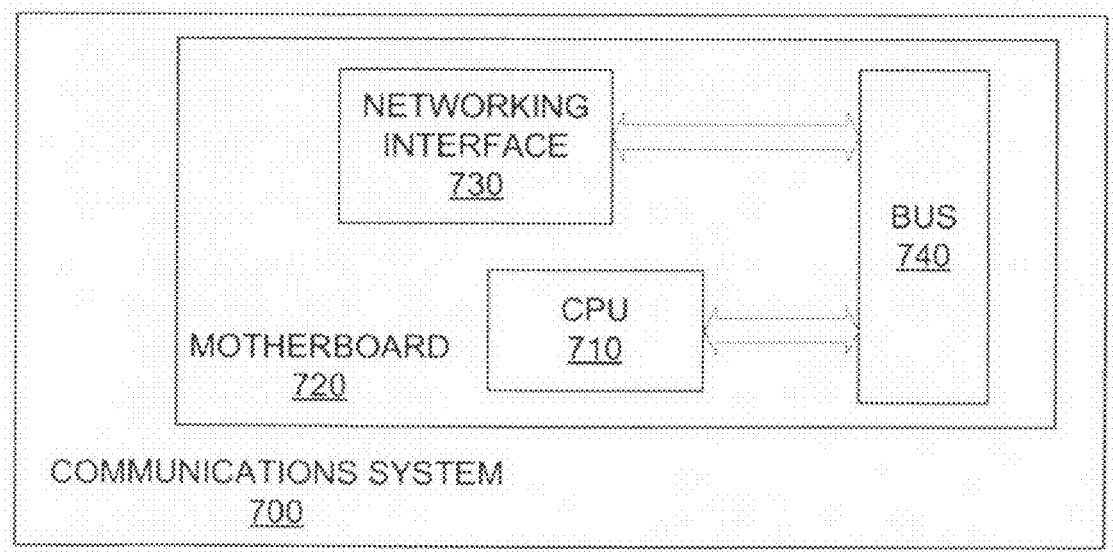
FIG. 7 illustrates a system with a central processing unit comprising dual metal interconnects.

FIG. 7 illustrates a communications system 700 with a central processing unit (CPU) 710 comprising dual metal interconnects in accordance with one embodiment. The communications system 700 may include a motherboard 720 with the CPU 710, and a networking interface 730 coupled to a bus 740. More specifically, the CPU 710 may comprise the earlier described dual metal interconnect structure and/or its method of fabrication. Depending on the applications, the communications system 700 may additionally include other components described herein, including but are not limited to volatile and non-volatile memory, a graphics processor, a digital signal processor, a crypto processor, a chipset, mass storage (such as hard disk, compact disk (CD), digital versatile disk (DVD)), and so forth. One or more of these components may also include the earlier described dual metal interconnect structure and/or its method of fabrication. In various embodiments, communications system 700 may be a personal digital assistant (PDA), a mobile device, a tablet computing device, a laptop computing device, a desktop computing device, a set-top box, an entertainment control unit, a digital camera, a digital video recorder, a CD player, a DVD player, or other digital device of the like.

Figure 8:
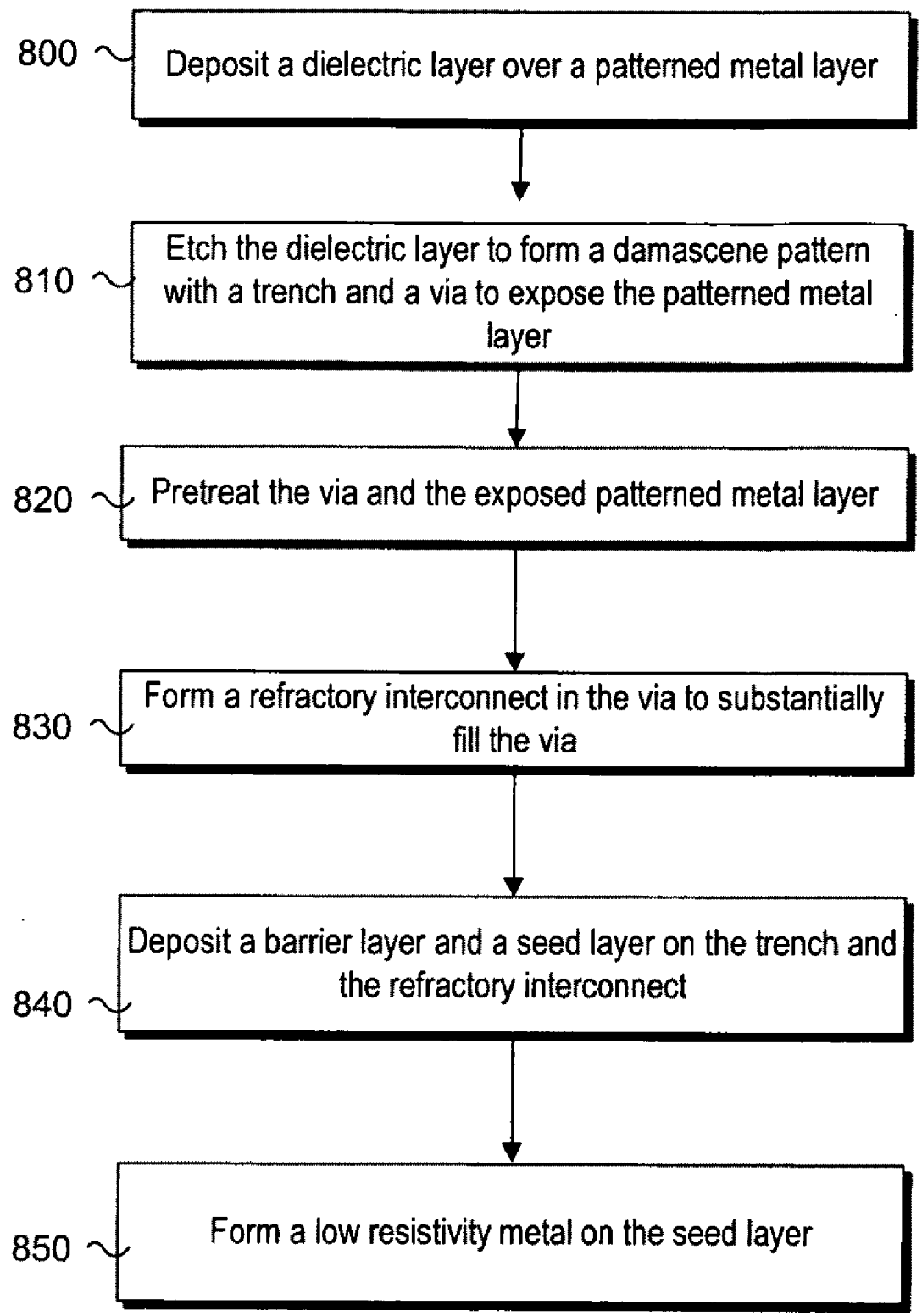
FIG. 8 is a flowchart describing one embodiment of a fabrication process used to form dual metal interconnect structures.

FIG. 8 is a flowchart describing one embodiment of a fabrication process used to form dual metal interconnect structures. In element 800, a dielectric layer is deposited over a patterned metal layer. In element 810, the dielectric layer is etched to form a damascene pattern with a trench and an opening to expose the patterned metal layer. The opening is pretreated and the patterned metal layer is exposed in element 820. In element 830, a refractory interconnect 310 is formed in the opening to substantially fill the opening. A barrier layer 410 is deposited and a seed layer is formed on the trench and the refractory interconnect 310 in element 840. A low resistivity metal is formed on the seed layer in element 850 to form a trench interconnect 420. The process described in FIG. 8 may be repeated one or more times to provide a plurality of additional conductors.

A plurality of embodiments of an apparatus and methods for forming dual metal interconnect structures have been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming dual metal interconnects comprising:
    depositing a dielectric layer over a patterned metal layer, etching the dielectric layer to form a trench directly adjacent to an opening to form a pathway from a top surface of the dielectric layer to the patterned metal layer to expose an underlying metal surface of the patterned metal layer, forming a refractory metal interconnect in the opening wherein the refractory interconnect may be formed with or contain boron or phosphorus or a combination of the two to impart amorphous properties, wherein the refractory metal interconnect is formed directly adjacent to the underlying metal surface and a wall of the opening to substantially fill the opening, depositing a barrier layer on and directly adjacent to a surface of the trench and the refractory metal interconnect, and forming a second metal on the barrier layer.

2. The method claim 1, further comprising forming the refractory metal interconnect by electroless deposition.

3. The method of claim 2, wherein electrolessly depositing the refractory metal interconnect comprises electrolessly depositing refractory material selected from the group comprising cobalt (Co), nickel (Ni), palladium (Pd), platinum (Pt), tungsten (W), ruthenium (Ru), and alloys thereof.

4. The method of claim 1, further including pretreating the opening and the underlying metal surface.

5. The method of claim 4, wherein pretreating the opening comprises using argon (Ar) ion bombardment or a plasma process formed using a mixture of hydrogen ($H_2$) and helium (He) or a mixture of $H_2$ and Ar.

6. The method of claim 1, wherein the refractory metal interconnect is not formed using a physical vapor deposition (PVD) or an atomic layer deposition (ALD) process.

7. The method of claim 1, wherein the refractory metal interconnect is formed using a process that does not form a seam in the refractory metal interconnect.

8. A method comprising:
    providing a substrate having formed thereon a dielectric layer, wherein a trench is formed on a via to expose an underlying metal surface;
    depositing a refractory interconnect in the via directly adjacent to the underlying metal surface, wherein the refractory interconnect is deposited by bottom-up electroless plating on the underlying metal surface and the refractory interconnect substantially fills the via wherein the refractory interconnect may be formed with or contain boron or phosphorus or a combination of the two to impart amorphous properties;
    depositing a trench interconnect in the trench, wherein the trench interconnect and the refractory interconnect are formed of different metals.

9. The method of claim 8, wherein electrolessly depositing the refractory interconnect comprises electrolessly depositing refractory material selected from the group comprising cobalt (Co), nickel (Ni), palladium (Pd), platinum (Pt), tungsten (W), ruthenium (Ru), and alloys thereof.

10. The method of claim 8, further including pretreating the via and the underlying metal surface.

11. The method of claim 10, wherein pretreating the via and the underlying metal surface comprises using argon (Ar) ion bombardment or a plasma process formed using a mixture of hydrogen ($H_2$) and helium (He) or a mixture of $H_2$ and Ar.

12. The method of claim 8, wherein the via is a high aspect ratio feature, with an aspect ratio at or above 3:1.

13. The method of claim 12, wherein an opening width of the via is substantially equal to or larger than 50 nanometers (nm).

14. The method of claim 8 wherein the dielectric layer is formed from a low-k dielectric material.

* * * * *